(12) United States Patent
Yoon (10) Patent No.: US 8,320,199 B2
(45) Date of Patent: Nov. 27, 2012

(54) DATA OUTPUT CIRCUIT FOR SEMICONDUCTOR MEMORY DEVICE

(75) Inventor: Young-Jun Yoon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 16 days.

(21) Appl. No.: 12/875,932

(22) Filed: Sep. 3, 2010

(65) Prior Publication Data

US 2012/0008428 A1   Jan. 12, 2012

(30) Foreign Application Priority Data

Jul. 6, 2010 (KR) ........................ 10-2010-0064911

(51) Int. Cl.
*G11C 7/00* (2006.01)
(52) U.S. Cl. ................................. 365/189.14
(58) Field of Classification Search .............. 327/108
See application file for complete search history.

(56) References Cited

U.S. PATENT DOCUMENTS

| | | | | |
|---|---|---|---|---|
| 5,448,182 A * | 9/1995 | Countryman et al. | ......... | 326/30 |
| 6,470,465 B1 * | 10/2002 | Shim et al. | ................ | 714/718 |
| 7,362,127 B2 * | 4/2008 | Tokuhiro et al. | ............... | 326/30 |
| 7,486,116 B2 * | 2/2009 | Egerer et al. | ................ | 327/108 |
| 2002/0030523 A1 * | 3/2002 | Muljono et al. | ............ | 327/170 |
| 2005/0163273 A1 * | 7/2005 | Scheffel | ................. | 375/354 |

FOREIGN PATENT DOCUMENTS

| KR | 1020040005091 | 1/2004 |
|---|---|---|
| KR | 1020090015724 | 2/2009 |

OTHER PUBLICATIONS

Notice of Allowance issued by the Korean Intellectual Property Office on Mar. 28, 2012.

* cited by examiner

*Primary Examiner* — Hoai V Ho
*Assistant Examiner* — Min Huang
(74) *Attorney, Agent, or Firm* — IP & T Group LLP (57) ABSTRACT

A data output circuit for a semiconductor memory device includes a first driver configured to output a first drive control signal in response to a data signal, a drive controller configured to compare a voltage level of the first drive control signal with a reference voltage and output a second drive control signal, and a second driver configured to drive an output terminal in response to the first drive control signal and additionally drive the output terminal in response to the second drive control signal.

18 Claims, 6 Drawing Sheets

DATA OUTPUT CIRCUIT FOR SEMICONDUCTOR MEMORY DEVICE

CROSS-REFERENCE TO RELATED APPLICATIONS

The present application claims priority of Korean Patent Application No. 10-2010-0064911, filed on Jul. 6, 2010, which is incorporated herein by reference in its entirety.

BACKGROUND OF THE INVENTION

Exemplary embodiments of the present invention relate to a semiconductor technology, and more particularly, to a data output circuit of a semiconductor memory device.

A semiconductor memory device generally includes a data output circuit for outputting internally stored data signals to the outside. Particularly, a data output circuit of a semiconductor memory device applied to a personal computer (PC) may include an On Die Terminal (ODT). The ODT controls a resistance value on the part of a data pad when a semiconductor memory device is integrated with a board so that data signals are transferred without impedance mismatch between the semiconductor memory device and the board. Meanwhile, a data output circuit of a semiconductor memory device used for consumer products such as a set-top box, a navigation system, a digital television (DTV) and the like may not be equipped with an ODT in order to save costs. Hereafter, a data output circuit of a semiconductor memory device without an ODT is described.

Figure 1:
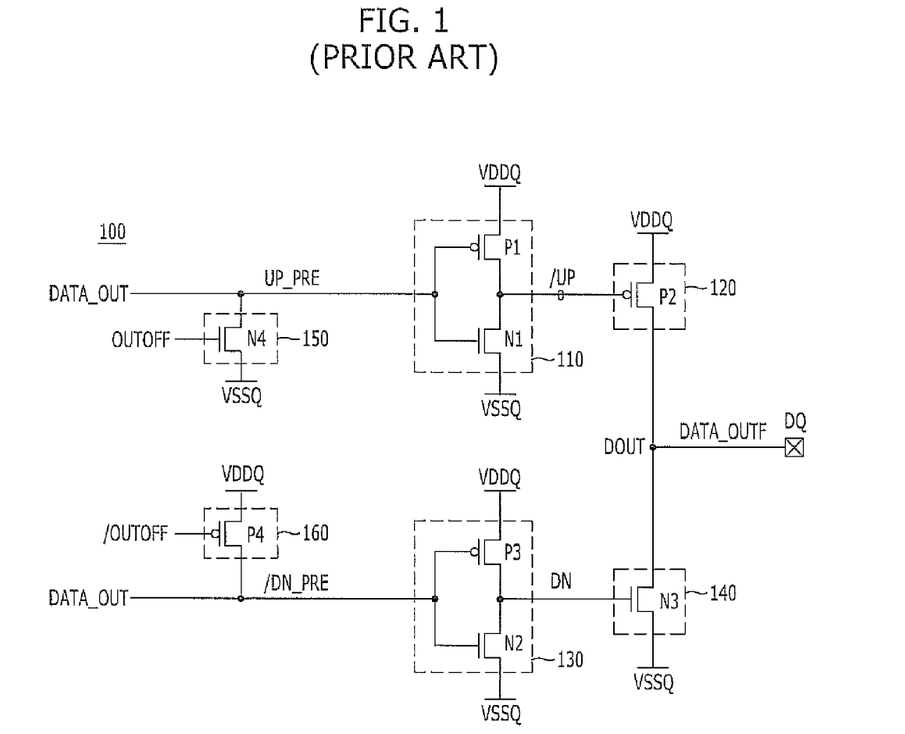
FIG. 1 is a circuit diagram illustrating a data output circuit of a conventional semiconductor memory device.

FIG. 1 is a circuit diagram illustrating a data output circuit of a conventional semiconductor memory device.

Referring to FIG. 1, the data output circuit 100 includes a pull-up pre-driver 110, a pull-up main driver 120, a pull-down pre-driver 130, a pull-down main driver 140, a pull-up state converter 150, and a pull-down state converter 160. The pull-up pre-driver 110 outputs a pull-up drive control signal /UP in response to a data signal DATA_OUT transferred from a memory cell (not shown). The pull-up main driver 120 pull-up drives a final output terminal DOUT in response to the pull-up drive control signal /UP. The pull-down pre-driver 130 outputs a pull-down drive control signal DN in response to a data signal DATA_OUT transferred from a memory cell (not shown). The pull-down main driver 140 pull-down drives a final output terminal DOUT in response to the pull-down drive control signal DN. The pull-up state converter 150 is coupled with an input terminal of the pull-up pre-driver 110 in parallel and converts the state of the final output terminal DOUT into a high impedance (Hi-Z) state in response to an off signal OUTOFF. The pull-down state converter 160 is coupled with an input terminal of the pull-down pre-driver 130 in parallel and converts the state of the final output terminal DOUT into a high impedance (Hi-Z) state in response to an off bar signal /OUTOFF, which is an inversion of the off signal OUTOFF.

The pull-up pre-driver 110 may include an inverter. For example, the pull-up pre-driver 110 may include a first PMOS transistor P1 and a first NMOS transistor N1. The first PMOS transistor P1 receives the data signal DATA_OUT as a gate input and includes source/drain terminals coupled to a terminal of a power source voltage VDDQ and an output terminal of the pull-up pre-driver 110. The first NMOS transistor N1 receives the data signal DATA_OUT as a gate input and includes source/drain terminals coupled to a terminal of a ground voltage VSSQ and the output terminal of the pull-up pre-driver 110. The pull-up main driver 120 may include a second PMOS transistor P2 which receives the pull-up drive control signal /UP as a gate input and includes source/drain terminals coupled to the terminal of the power source voltage VDDQ and the final output terminal DOUT.

The pull-down pre-driver 130 may include an inverter, just as the pull-up pre-driver 110 does. To be specific, the pull-down pre-driver 130 may include a third PMOS transistor P3 and a second NMOS transistor N2. The third PMOS transistor P3 receives the data signal DATA_OUT as a gate input and includes source/drain terminals coupled to the terminal of the power source voltage VDDQ and an output terminal of the pull-down pre-driver 130. The second NMOS transistor N2 receives the data signal DATA_OUT as a gate input and includes source/drain terminals coupled to the terminal of the ground voltage VSSQ and the output terminal of the pull-down pre-driver 130.

The pull-down main driver 140 may include a third NMOS transistor N3 which receives the pull-down drive control signal DN as a gate input and includes source/drain terminals coupled to the terminal of the ground voltage VSSQ and the final output terminal DOUT.

The pull-up state converter 150 includes a fourth NMOS transistor N4 which receives the off signal OUTOFF as a gate input and includes source/drain terminals coupled to the terminal of the ground voltage VSSQ and the input terminal of the pull-up pre-driver 110. Herein, the off signal OUTOFF is a high active signal for making the state of the final output terminal DOUT into a high impedance (Hi-Z) state after a read operation is finished. The final output terminal DOUT becomes the high impedance (Hi-Z) state after a read operation is finished so as to prevent a conflict between signals that may occur through a data pad DQ.

The pull-down state converter 160 includes a fourth PMOS transistor P4 which receives the off bar signal /OUTOFF as a gate input and includes source/drain terminals coupled to the terminal of the power source voltage VDDQ and the input terminal of the pull-down pre-driver 130.

Hereafter, an operation of the conventional data output circuit 100 having the structure shown in FIG. 1 is described with reference to FIG. 2.

Figure 2:
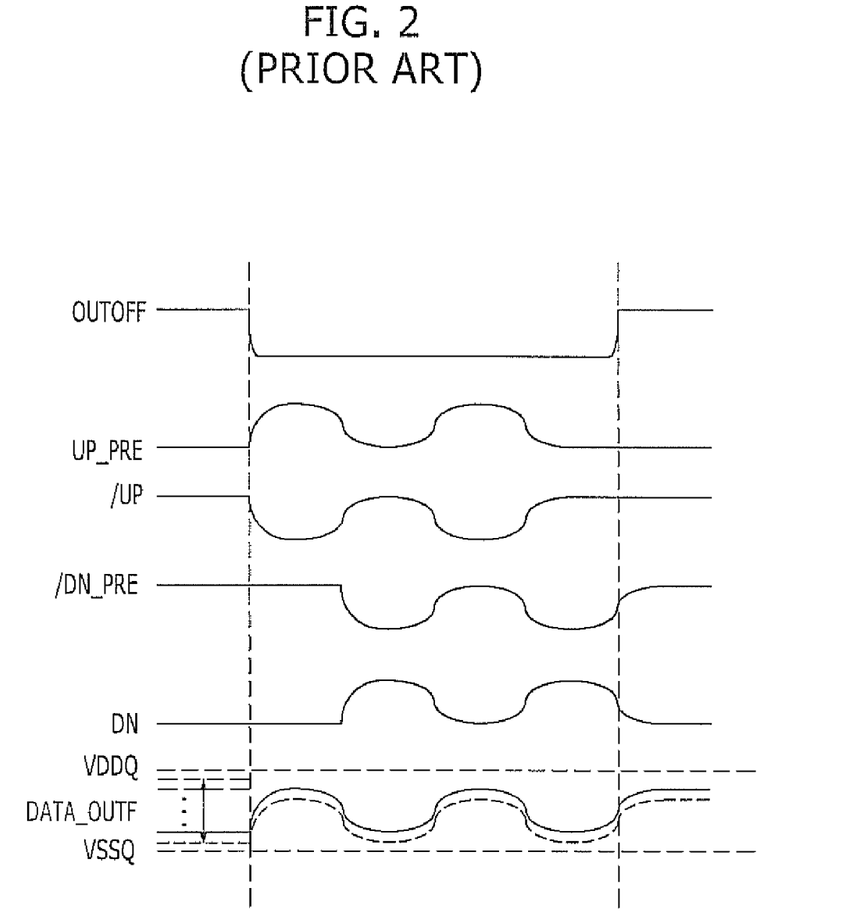
FIG. 2 is a timing diagram illustrating an operation of the data output circuit of the conventional semiconductor memory device.

FIG. 2 is a timing diagram illustrating the operation of the data output circuit 100 shown in FIG. 1.

Referring to FIG. 2, since the off signal OUTOFF maintains an enabled state, which is a logic high level state, before a read operation is performed, the pull-up state converter 150 and the pull-down state converter 160 are turned on. Accordingly, a pull-up state conversion signal UP_PRE of a logic low level is inputted into the input terminal of the pull-up pre-driver 110. Therefore, the pull-up main driver 120 receives the pull-up drive control signal /UP of a logic high level and it is turned off. Meanwhile, the input terminal of the pull-down pre-driver 130 receives a pull-down state conversion signal /DN_PRE of a logic high level. Therefore, the pull-down main driver 140 receives the pull-down drive control signal DN of a logic low level and it is turned off. Accordingly, the final output terminal DOUT becomes a high impedance (Hi-Z) state, generating a voltage level which is neither a logic high level nor a logic low level. In short, an external data signal DATA_OUTF outputted through the final output terminal DOUT may have an arbitrary/floating voltage level between the power source voltage VDDQ level and a ground voltage VSSQ level.

As the read operation is performed in this state, the off signal OUTOFF is disabled, that is, the off signal OUTOFF transitions from a logic high level to a logic low level. Of course, the off bar signal /OUTOFF transitions from a logic low level to a logic high level. Then, the pull-up state converter 150 and the pull-down state converter 160 are turned off, and the data signal DATA_OUT begins to enter the input terminals of the pull-up pre-driver 110 and the pull-down pre-driver 130. In other words, the data signal DATA_OUT enters the input terminal of the pull-up pre-driver 110 as the pull-up state conversion signal UP_PRE, and the data signal DATA_OUT enters the input terminal of the pull-down pre-driver 130 as the pull-down state conversion signal /DN_PRE. Accordingly, the pull-up pre-driver 110 outputs the pull-up drive control signal /UP, which is an inversion of the pull-up state conversion signal UP_PRE, and the pull-down pre-driver 130 outputs the pull-down drive control signal DN, which is an inversion of the pull-down state conversion signal /DN_PRE. Therefore, the pull-up main driver 120 pull-up drives the final output terminal DOUT in response to the pull-up drive control signal /UP, and the pull-down main driver 140 pull-down drives the final output terminal DOUT in response to the pull-down drive control signal DN. Thus, the external data signal DATA_OUTF is outputted to the outside through the data pad DQ.

Subsequently, after the read operation is ended, the off signal OUTOFF transitions from a logic low level to a logic high level, and the pull-up state converter 150 and the pull-down state converter 160 are turned on. Then, as described above, since the pull-up main driver 120 and the pull-down main driver 140 are turned off, the state of the final output terminal DOUT returns to the high impedance (Hi-Z) state.

According to the conventional data output circuit 100, when a read operation is not performed, the state of the final output terminal DOUT is converted into the high impedance (Hi-Z) state and thereby conflict between signals which may occur through the data pad DQ may be prevented.

However, the conventional data output circuit 100 has the following concerns.

The high impedance (Hi-Z) state means a third state which is neither a logic high level nor a logic low level, and the final output terminal DOUT may have an arbitrary voltage value between the power source voltage VDDQ level and the ground voltage VSSQ level in the high impedance (Hi-Z) state. In this case, the external data signal DATA_OUTF which begins to be outputted through the final output terminal DOUT when a read operation is initiated may be affected by the arbitrary value. For example, as illustrated in FIG. 2, when the arbitrary value is close to the ground voltage VSSQ level at the moment when the external data signal DATA_OUTF begins to be outputted through the final output terminal DOUT, swing may not be sufficiently performed to the power source voltage VDDQ level. Therefore, the signal integrity (SI) characteristics of the data output circuit 100 may be deteriorated and a yield loss of the semiconductor memory device may occur. However, if the data output circuit 100 includes an ODT, the final output terminal DOUT may not maintain an arbitrary value level but instead maintains a half power source voltage VDDQ/2 level, which corresponds to a level that is half of the power source voltage VDDQ level. Thus, full swing may be performed at the moment when the external data signal DATA_OUTF is outputted. In this case, however, the presence of the ODT may induce a loss of net die.

Meanwhile, to address the concerns of the conventional data output circuit 100, that is, to improve the signal integrity (SI) characteristics of the data output circuit 100, the sizes of the pull-up main driver 120 and the pull-down main driver 140 may be increased. In this case, however, an overshoot and/or undershoot phenomenon may occur in the external data signal DATA_OUTF outputted through the data pad DQ.

SUMMARY OF THE INVENTION

Exemplary embodiments of the present invention are directed to a data output circuit for a semiconductor memory device which may prevent an overshoot and/or undershoot phenomenon while improving signal integrity (SI) characteristics.

In accordance with an exemplary embodiment of the present invention, a data output circuit for a semiconductor memory device includes a first driver configured to output a first drive control signal in response to a data signal, a drive controller configured to compare a voltage level of the first drive control signal with a reference voltage and output a second drive control signal, and a second driver configured to drive an output terminal in response to the first drive control signal and additionally drive the output terminal in response to the second drive control signal.

In accordance with another exemplary embodiment of the present invention, a data output circuit for a semiconductor memory device includes a pre-driver configured to output a first drive control signal in response to a data signal, a main driver configured to drive an output terminal in response to the first drive control signal, a drive controller configured to compare a voltage level of the first drive control signal with a reference voltage and output a second drive control signal, and an auxiliary driver configured to drive the output terminal in response to the second drive control signal.

In accordance with yet another exemplary embodiment of the present invention, a data output circuit for a semiconductor memory device includes a first pre-driver configured to output a pull-up drive control signal in response to a data signal, a second pre-driver configured to output a pull-down drive control signal in response to the data signal, a first main driver configured to pull-up drive an output terminal in response to the pull-up drive control signal, a second main driver configured to pull-down drive the output terminal in response to the pull-down drive control signal, a first sensor configured to sense whether a voltage level of the pull-up drive control signal is lower than a voltage level of a first reference voltage and output a first sense signal, a second sensor configured to sense whether a voltage level of the pull-down drive control signal is higher than a voltage level of a second reference voltage and output a second sense signal, a first auxiliary driver configured to pull-up drive the output terminal in response to the first sense signal, and a second auxiliary driver configured to pull-down drive the output terminal in response to the second sense signal.

DESCRIPTION OF SPECIFIC EMBODIMENTS

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
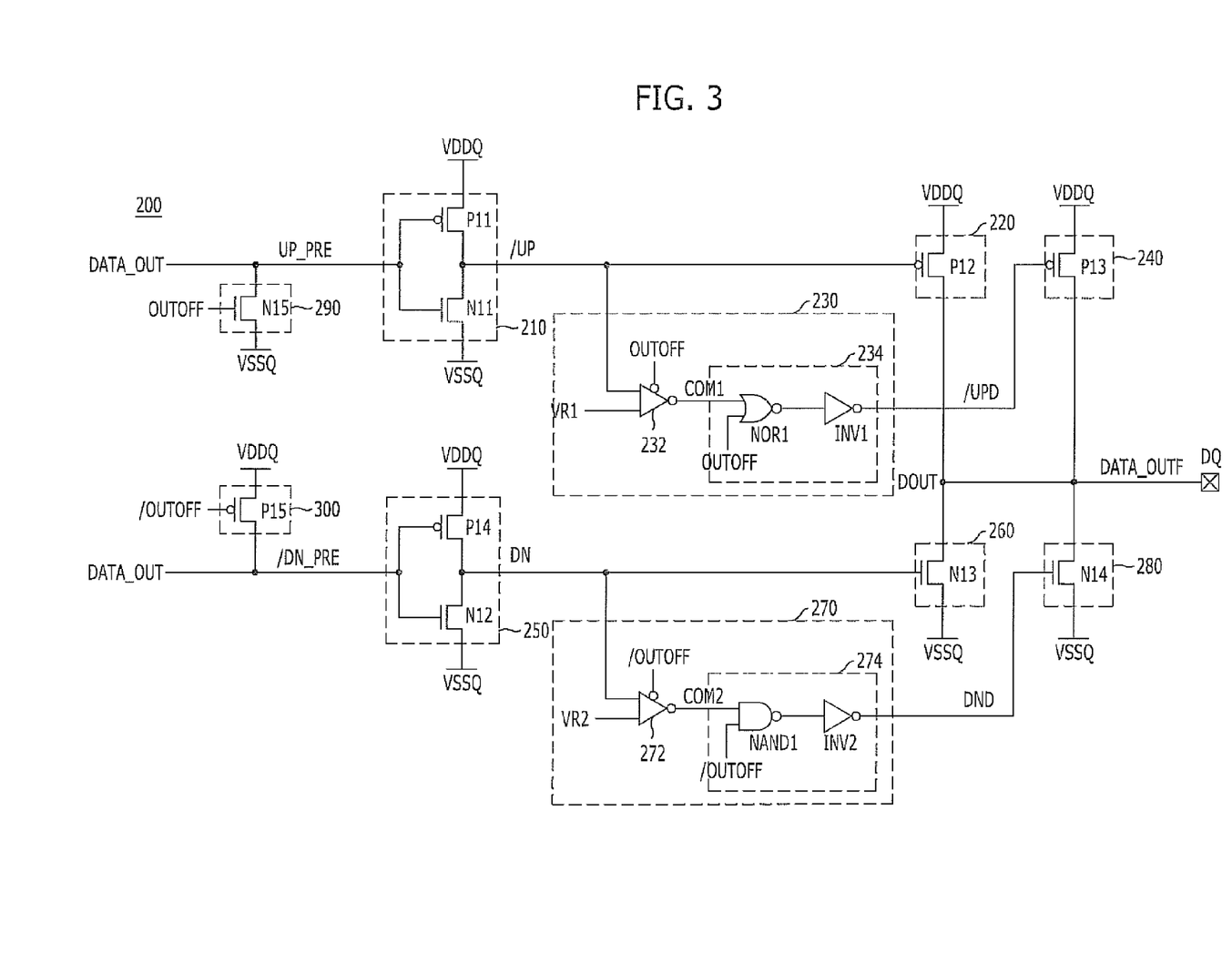
FIG. 3 is a circuit diagram illustrating a data output circuit of a semiconductor memory device in accordance with an exemplary embodiment of the present invention.

FIG. 3 is a circuit diagram illustrating a data output circuit of a semiconductor memory device in accordance with an exemplary embodiment of the present invention.

Referring to FIG. 3, the data output circuit 200 includes a pull-up pre-driver 210, a pull-up main driver 220, a pull-up sensor 230, a pull-up auxiliary driver 240, a pull-down pre-driver 250, a pull-down main driver 260, a pull-down sensor 270, and a pull-down auxiliary driver 280. The pull-up pre-driver 210 outputs a pull-up drive control signal /UP in response to a data signal DATA_OUT. The pull-up main driver 220 pull-up drives a final output terminal DOUT in response to the pull-up drive control signal /UP. The pull-up sensor 230 senses whether the voltage level of the pull-up drive control signal /UP is lower than a predetermined first reference voltage VR1 and outputs a first sense signal /UPD. The pull-up auxiliary driver 240 additionally pull-up drives the final output terminal DOUT in response to the first sense signal /UPD. The pull-down pre-driver 250 outputs a pull-down drive control signal DN in response to a data signal DATA_OUT. The pull-down main driver 260 pull-down drives the final output terminal DOUT in response to the pull-down drive control signal DN. The pull-down sensor 270 senses whether the voltage level of the pull-down drive control signal DN is higher than the voltage level of a predetermined second reference voltage VR2, which is higher than the voltage level of the predetermined first reference voltage VR1, and outputs a second sense signal DND. The pull-down auxiliary driver 280 additionally pull-down drives the final output terminal DOUT in response to the second sense signal DND. Also, the data output circuit 200 may further include a pull-up state converter 290 and a pull-down state converter 300. The pull-up state converter 290 is coupled in parallel to an input terminal of the pull-up pre-driver 210, and converts the state of the final output terminal DOUT into a high impedance (Hi-Z) state in response to an off signal OUTOFF. The pull-down state converter 300 is coupled in parallel to an input terminal of the pull-down pre-driver 250, and converts the state of the final output terminal DOUT into a high impedance (Hi-Z) state in response to an off bar signal /OUTOFF, which is an inversion signal of the off signal OUTOFF. Herein, the off signal OUTOFF is a high active signal, which is a signal for making the final output terminal DOUT into a high impedance (Hi-Z) state after a read operation is finished. Herein, the final output terminal DOUT is made into the high impedance (Hi-Z) state after the read operation is finished so as to prevent a conflict between signals which may occur through a data pad DQ.

The pull-up pre-driver 210 may include an inverter. For example, the pull-up pre-driver 210 includes a first PMOS transistor P11 and a first NMOS transistor N11. The first PMOS transistor P11 receives the data signal DATA_OUT as a gate input, and includes source/drain terminals coupled to a terminal of a power source voltage VDDQ and an output terminal of the pull-up pre-driver 210. The first NMOS transistor N11 receives the data signal DATA_OUT as a gate input, and includes source/drain terminals coupled to a terminal of a ground voltage VSSQ and the output terminal of the pull-up pre-driver 210.

The pull-up main driver 220 includes a second PMOS transistor P12 which receives the pull-up drive control signal /UP as a gate input, and includes source/drain terminals coupled to the terminal of the power source voltage VDDQ and the final output terminal DOUT.

The pull-up sensor 230 includes a first comparison unit 232, and a first sense signal output unit 234. The first comparison unit 232 compares the voltage level of the pull-up drive control signal /UP with the predetermined first reference voltage VR1 and outputs a first comparison signal COM1. The first sense signal output unit 234 outputs the first sense signal /UPD in response to the first comparison signal COM1. The first comparison unit 232 is enabled in response to the off signal OUTOFF and enables the first comparison signal COM1 when the voltage level of the pull-up drive control signal /UP is lower than the first reference voltage VR1. Herein, a duration where the first comparison signal COM1 is enabled becomes a first additional driving duration for a pull-up driving operation. The first sense signal output unit 234 enables the first sense signal /UPD during the first additional driving duration in response to the off signal OUTOFF and the first comparison signal COM1. The first sense signal output unit 234 includes a first NOR gate NOR1 for receiving the off signal OUTOFF and the first comparison signal COM1 and performing a NOR operation, and a first inverter INV1 for inverting an output signal of the first NOR gate NOR1 and outputting the inverted output signal as the first sense signal /UPD. Herein, the first reference voltage VR1 may be set lower than a half power source voltage VDDQ/2, which corresponds to a voltage level that is half of the power source voltage VDDQ supplied to the pull-up pre-driver 210.

The pull-up auxiliary driver 240 includes a third PMOS transistor P13, which receives the first sense signal /UPD as a gate input and includes source/drain terminals coupled to the terminal of the power source voltage VDDQ and the final output terminal DOUT.

The pull-down pre-driver 250 may include an inverter, just as the pull-up pre-driver 210 does. To be specific, the pull-down pre-driver 250 includes a fourth PMOS transistor P14 and a second NMOS transistor N12. The fourth PMOS transistor P14 receives the data signal DATA_OUT as a gate input and includes source/drain terminals coupled to the terminal of the power source voltage VDDQ and an output terminal of the pull-down pre-driver 250. The second NMOS transistor N12 receives the data signal DATA_OUT as a gate input and includes source/drain terminals coupled to the terminal of the ground voltage VSSQ and the output terminal of the pull-down pre-driver 250.

The pull-down main driver 260 includes a third NMOS transistor N13 which receives the pull-down drive control signal DN as a gate input and includes source/drain terminals coupled to the terminal of the ground voltage VSSQ and the final output terminal DOUT.

The pull-down sensor 270 includes a second comparison unit 272 and a second sense signal output unit 274. The second comparison unit 272 compares the voltage level of the pull-down drive control signal DN with the second reference voltage VR2 and outputs a second comparison signal COM2. The second sense signal output unit 274 outputs the second sense signal DND in response to the second comparison signal COM2. The second comparison unit 272 is enabled in response to the off signal OUTOFF, and enables the second comparison signal COM2 when the voltage level of the pull-down drive control signal DN is higher than the second reference voltage VR2. Herein, the duration when the second comparison signal COM2 is enabled is a second additional driving duration for pull-down driving. The second sense signal output unit 274 enables the second sense signal DND during the second additional driving duration in response to the off bar signal /OUTOFF and the second comparison signal COM2. The second sense signal output unit 274 includes a first NAND gate NAND1 for receiving the off bar signal /OUTOFF and the second comparison signal COM2, and performing a NAND operation, and a second inverter INV2 for inverting an output signal of the first NAND gate NAND1 and outputting the inverted output signal as the second sense signal DND. Herein, the second reference voltage VR2 may be set higher than a half power source voltage VDDQ/2, which corresponds to a voltage level that is half of the power source voltage VDDQ supplied to the pull-down pre-driver 250.

The pull-down auxiliary driver 280 includes a fourth NMOS transistor N14 which receives the second sense signal DND as a gate input and includes source/drain terminals coupled to the terminal of the ground voltage VSSQ and the final output terminal DOUT.

The pull-up state converter 290 includes a fifth NMOS transistor N15 which receives the off signal OUTOFF as a gate input and includes source/drain terminals coupled to the terminal of the ground voltage VSSQ and an input terminal of the pull-up pre-driver 210.

The pull-down state converter 300 includes a fifth PMOS transistor P15 which receives the off bar signal /OUTOFF as a gate input and includes source/drain terminals coupled to the terminal of the power source voltage VDDQ and the input terminal of the pull-down pre-driver 250.

Figure 4:
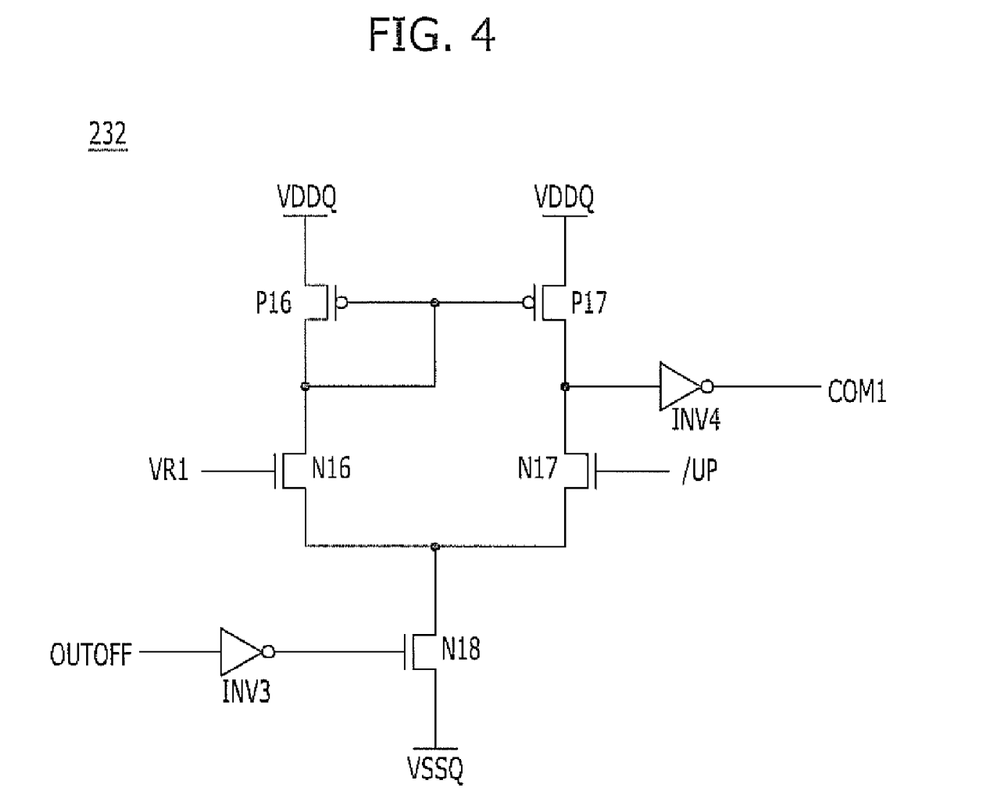
FIG. 4 is an internal circuit diagram illustrating a first comparison unit shown in FIG. 3.

Meanwhile, FIG. 4 is an internal circuit diagram illustrating the first comparison unit 232 shown in FIG. 3.

Referring to FIG. 4, the first comparison unit 232 includes differential input units N16 and N17, loading units P16 and P17, and a sinking unit N18. The differential input units N16 and N17 receive the pull-up drive control signal /UP and the first reference voltage VR1. The loading units P16 and P17 are respectively coupled between the differential input units N16 and N17 and the terminal of the power source voltage VDDQ. The sinking unit N18 is enabled in response to an inversion of the off signal OUTOFF obtained by a third inverter INV3, and is coupled between the differential input units N16 and N17 and the terminal of the ground voltage VSSQ. The first comparison signal COM1 is outputted through a fourth inverter INV4, which has an input terminal coupled to an output node between the loading unit P17 and the differential input unit N17. Since the first comparison unit 232 having the above structure is well known, a detailed description of it is omitted.

Meanwhile, although not illustrated in the drawing, the second comparison unit 272 shown in FIG. 3 may have the same structure as the first comparison unit 232, which is described above, except for input/output signals. That is, the second comparison unit 272 receives the pull-down drive control signal DN and the second reference voltage VR2, and outputs the second comparison signal COM2.

Hereafter, an operation of the data output circuit 200 having the above-described structure is described with reference to FIGS. 5 and 6 in accordance with an exemplary embodiment of the present invention.

Figure 5:
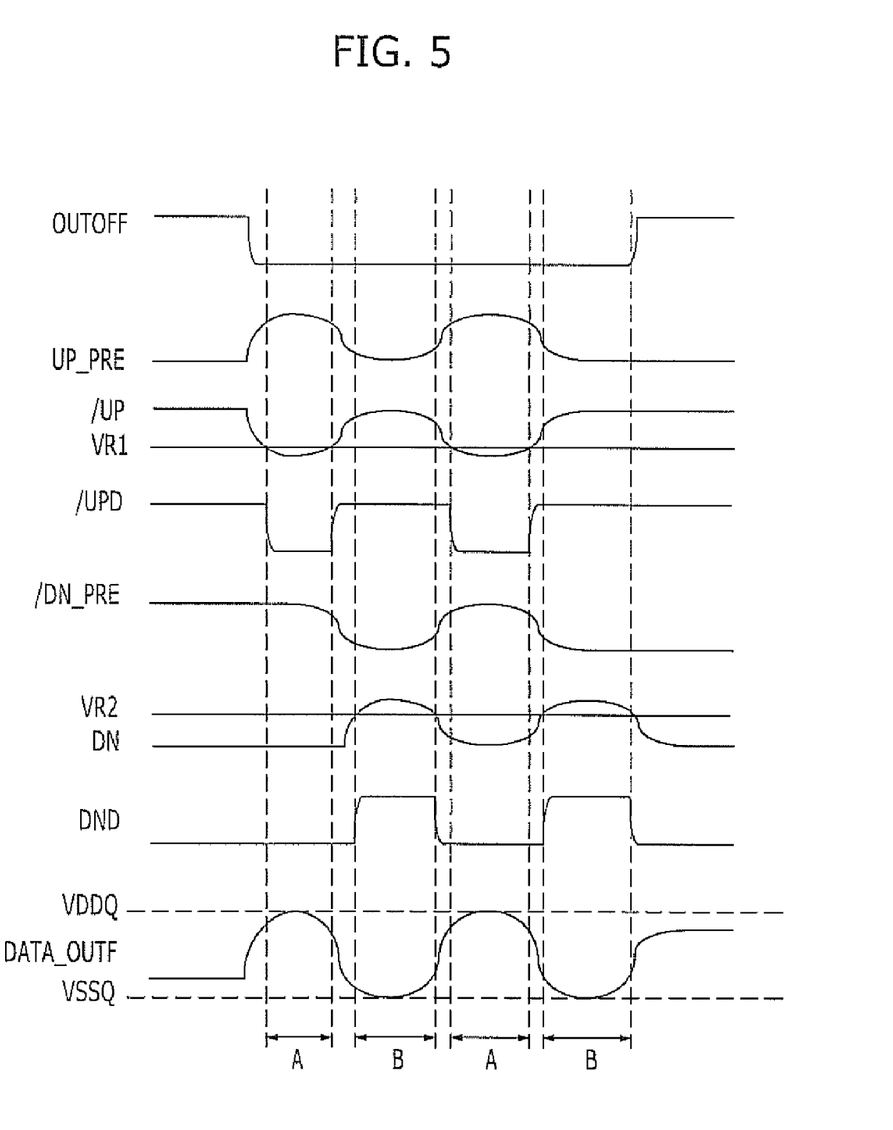
FIG. 5 is a timing diagram illustrating an operation of a data output circuit of a semiconductor memory device in accordance with an exemplary embodiment of the present invention.

FIG. 5 is a timing diagram illustrating an operation of a data output circuit of a semiconductor memory device in accordance with an exemplary embodiment of the present invention. FIG. 6 is a timing diagram illustrating a first sense signal shown in FIG. 5 in more detail.

In this exemplary embodiment of the present invention, it is assumed that the first reference voltage VR1 of the pull-up sensor 230 and the second reference voltage VR2 of the pull-down sensor 270 are set in consideration of overshoot and undershoot phenomena.

Referring to FIG. 5, the off signal OUTOFF is maintained in an enabled state, which is a logic high level state, until a read operation is performed. Of course, the off bar signal /OUTOFF has a logic low level. For this reason, the pull-up state converter 290 and the pull-down state converter 300 are turned on, and the pull-up state conversion signal UP_PRE of a logic low level is inputted into the input terminal of the pull-up pre-driver 210, and the pull-down state conversion signal /DN_PRE of a logic high level is inputted into the input terminal of the pull-down pre-driver 250. Then, the pull-up main driver 220 receives the pull-up drive control signal /UP of a logic high level and is turned off, and the pull-down main driver 260 receives the pull-down drive control signal DN of a logic low level and is turned off. At the same time, since the first sense signal /UPD outputted from the pull-up sensor 230 maintains the logic high level, while the second sense signal DND outputted from the pull-down sensor 270 maintains the logic low level, the pull-up auxiliary driver 240 and the pull-down auxiliary driver 280 are both turned off. Therefore, the external data signal DATA_OUTF outputted through the final output terminal DOUT maintains the high impedance (Hi-Z) state. In short, the external data signal DATA_OUTF may have an arbitrary voltage level between the power source voltage VDDQ level and the ground voltage VSSQ level.

As a read operation is formed in this state, the off signal OUTOFF is disabled, which means that the off signal OUTOFF transitions from a logic high level to a logic low level. Of course, the off bar signal /OUTOFF transitions from a logic low level to a logic high level. Then, the pull-up state converter 290 and the pull-down state converter 300 are turned off and the data signal DATA_OUT is inputted into the input terminals of the pull-up pre-driver 210 and the pull-down pre-driver 250. In other words, the input terminal of the pull-up pre-driver 210 receives the data signal DATA_OUT as the pull-up state conversion signal UP_PRE, and the input terminal of the pull-down pre-driver 250 receives the data signal DATA_OUT as the pull-down state conversion signal /DN_PRE. Therefore, the pull-up pre-driver 210 outputs the pull-up drive control signal /UP, which is an inversion of the pull-up state conversion signal UP_PRE, and the pull-down pre-driver 250 outputs the pull-down drive control signal DN, which is an inversion of the pull-down state conversion signal /DN_PRE. Accordingly, as the pull-up main driver 220 pull-up drives the final output terminal DOUT in response to the pull-up drive control signal /UP, and the pull-down main driver 260 pull-down drives the final output terminal DOUT in response to the pull-down drive control signal DN, the external data signal DATA_OUTF is toggled.

Herein, when the voltage level of the pull-up drive control signal /UP is lower than the first reference voltage VR1, i.e., in the first additional driving duration A for pull-up driving, the pull-up sensor 230 enables and outputs the first sense signal /UPD. When the voltage level of the pull-down drive control signal DN is higher than the second reference voltage VR2, i.e., in the second additional driving duration B for pull-down driving, the pull-down sensor 270 enables and outputs the second sense signal DND. Accordingly, the pull-up auxiliary driver 240 additionally pull-up drives the final output terminal DOUT in the first additional driving duration A in response to the first sense signal /UPD, and the pull-down auxiliary driver 280 additionally pull-down drives the final output terminal DOUT in the second additional driving duration B in response to the second sense signal DND.

Therefore, regardless of the voltage level of the final output terminal DOUT at the moment when a read operation begins, the external data signal DATA_OUTF may perform a full swing through the additional driving, during the first and second additional driving durations A and B, which is performed in addition to the pull-up/pull-down main driving. Herein, the first and second additional driving durations A and B may be defined according to how the first and second reference voltages VR1 and VR2 are set up. Therefore, as described above, the first and second reference voltages VR1 and VR2 can be set so that overshoot and undershoot does not occur to the external data signal DATA_OUTF.

After the read operation is finished, the state of the off signal OUTOFF is switched into an enabled state, which means that the off signal OUTOFF transitions from a logic low level to a logic high level, and the pull-up state converter 290 and the pull-down state converter 300 are turned on. As described above, the pull-up main driver 220, the pull-up auxiliary driver 240, the pull-down main driver 260, and the pull-down auxiliary driver 280 are all turned off, and thus, the state of the external data signal DATA_OUTF returns to the high impedance (Hi-Z) state.

Figure 6:
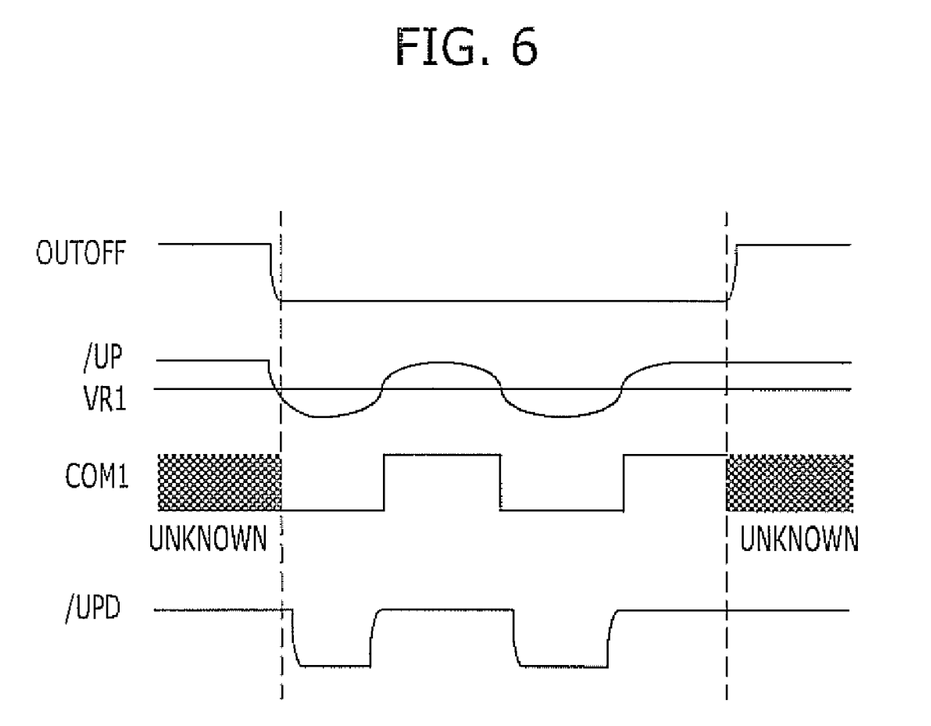
FIG. 6 is a timing diagram illustrating a first sense signal shown in FIG. 5 in more detail.

FIG. 6 is a timing diagram illustrating the first sense signal /UPD in more detail.

Referring to FIG. 6, since the first comparison unit 232 is disabled when the off signal OUTOFF is enabled, which means that the off signal OUTOFF is in a logic high level, the first comparison signal COM1, which is an output signal thereof, is in an unknown/undetermined state. Therefore, the first sense signal output unit 234 outputs/maintains the first sense signal /UPD of a logic high level. In other words, since the first NOR gate NOR1 receives the off signal OUTOFF of the logic high level as one input, it outputs an output signal of a logic low level regardless of the value of the other input, and the output signal is inverted by the first inverter INV1 and outputted as the first sense signal /UPD of the logic high level.

Meanwhile, when the off signal OUTOFF is disabled, which means that the off signal OUTOFF is in a logic low level, the first comparison unit 232 is enabled and compares the pull-up drive control signal /UP with the first reference voltage VR1. When the pull-up drive control signal /UP is lower than the first reference voltage VR1, the first comparison signal COM1 of a logic low level is outputted, and when the pull-up drive control signal /UP is higher than the first reference voltage VR1, the first comparison signal COM1 of a logic high level is outputted. Accordingly, the first sense signal output unit 234 buffers the toggled first comparison signal COM1 and outputs it as the first sense signal /UPD. In other words, since the first NOR gate NOR1 receives the off signal OUTOFF of the logic low level as one input, it inverts the other input and outputs an inverted signal. The output signal of the first NOR gate NOR1 is inverted by the first inverter INV1 again and outputted as the first sense signal /UPD.

Meanwhile, since the second sense signal DND goes through a similar operation to that of the first sense signal /UPD, a detailed description of it is omitted herein.

According to an exemplary embodiment of the present invention, which is described above, an additional driving is performed on the final output terminal DOUT during the certain first and second additional driving durations A and B in addition to the main driving, when the external data signal DATA_OUTF is outputted during a read operation. In this way, overshoot and undershoot phenomena may be prevented as well as increasing signal integrity (SI) characteristics.

The technology of the present invention may improve signal integrity (SI) characteristics by additionally driving an output terminal. Also, the technology of the present invention may prevent overshoot and/or undershoot phenomenon by performing the additional driving within a certain duration while improving the signal integrity (SI) characteristics.

While the present invention has been described with respect to the specific embodiments, it will be apparent to those skilled in the art that various changes and modifications may be made without departing from the spirit and scope of the invention as defined in the following claims.

What is claimed is:

1. A data output circuit for a semiconductor memory device, comprising:
    a first driver configured to output a first drive control signal in response to a data signal;
    a drive controller configured to compare a voltage level of the first drive control signal with a reference voltage and output a second drive control signal; and
    a second driver configured to drive an output terminal in response to the first drive control signal and additionally drive the output terminal in response to the second drive control signal,
    wherein a level of the reference voltage is set to determine a duration of the additional driving by the second driver.

2. The data output circuit of claim 1, further comprising:
    a state converter coupled to an input terminal of the first driver and configured to convert a state of the output terminal into a high impedance (Hi-Z) state depending on an input of the data signal.

3. A data output circuit for a semiconductor memory device, comprising:
    a pre-driver configured to output a first drive control signal in response to a data signal;
    a main driver configured to drive an output terminal in response to the first drive control signal;
    a drive controller configured to compare a voltage level of the first drive control signal with a reference voltage and output a second drive control signal; and
    an auxiliary driver configured to drive the output terminal in response to the second drive control signal,
    wherein a level of the reference voltage is set to determine a duration of a drive operation of the auxiliary driver.

4. The data output circuit of claim 3, further comprising:
    a state converter coupled to an input terminal of the pre-driver and configured to convert a state of the output terminal into a high impedance (Hi-Z) state in response to an off signal.

5. The data output circuit of claim 4, wherein the drive controller comprises:
    a comparison unit configured to compare the voltage level of the first drive control signal with the reference voltage and output a comparison signal; and
    an output unit configured to output the second drive control signal in response to the comparison signal and the off signal.

6. The data output circuit of claim 5, wherein whether to enable or disable the comparison unit is determined based on the off signal.

7. The data output circuit of claim 6, wherein the off signal is activated depending on a read operation of the semiconductor memory device.

8. A data output circuit for a semiconductor memory device, comprising:
    a first pre-driver configured to output a pull-up drive control signal in response to a data signal;
    a second pre-driver configured to output a pull-down drive control signal in response to the data signal;

a first main driver configured to pull-up drive an output terminal in response to the pull-up drive control signal;

a second main driver configured to pull-down drive the output terminal in response to the pull-down drive control signal;

a first sensor configured to compare the pull-up drive control signal with a reference voltage and output a first sense signal;

a second sensor configured to compare the pull-down control signal with a second reference voltage and output a second sense signal;

a first auxiliary driver configured to pull-up drive the output terminal in response to the first sense signal; and a second auxiliary driver configured to pull-down drive the output terminal in response to the second sense signal.

9. The data output circuit of claim 8, wherein the first reference voltage is lower than a half power source voltage having a voltage level that is half of a power source voltage supplied to the first pre-driver.

10. The data output circuit of claim 9, wherein the second reference voltage is higher than the half power source voltage.

11. The data output circuit of claim 8, further comprising:

a first state converter provided to an input terminal of the first pre-driver and configured to convert a state of the output terminal into a high impedance (Hi-Z) state in response to an off signal; and a second state converter provided to an input terminal of the second pre-driver and configured to convert a state of the output terminal into a high impedance (Hi-Z) state in response to an off bar signal, which is an inversion of the off signal.

12. The data output circuit of claim 11, wherein the first sensor comprises:

a comparison unit configured to compare a voltage level of the pull-up drive control signal with that of the first reference voltage and output a comparison signal; and a sense signal output unit configured to output the first sense signal in response to the comparison signal and the off signal.

13. The data output circuit of claim 12, wherein whether to enable or disable the comparison unit is determined based on the off signal.

14. The data output circuit of claim 12, wherein the sense signal output unit outputs the comparison signal as the first sense signal in response to the off signal.

15. The data output circuit of claim 11, wherein the second sensor comprises:

a comparison unit configured to compare a voltage level of the pull-down drive control signal with that of the second reference voltage and output a comparison signal; and a sense signal output unit configured to output the second sense signal in response to the comparison signal and the off bar signal.

16. The data output circuit of claim 15, wherein whether to enable or disable the comparison unit is determined based on the off bar signal.

17. The data output circuit of claim 15, wherein the second sense signal output unit outputs the comparison signal as the second sense signal in response to the off bar signal.

18. The data output circuit of claim 8, wherein the second reference voltage is higher than the first reference voltage, which are set to determine durations of pull-up driving and pull-down driving by the first and second auxiliary drivers, respectively.

* * * * *